United States Patent [19]

Brady et al.

[11] Patent Number: 5,512,376
[45] Date of Patent: Apr. 30, 1996

[54] NONPOLAR POLYMERS COMPRISING ANTIPLASTICIZERS

[75] Inventors: Richard L. Brady; Samuel A. Thompson, both of Wilmington, Del.

[73] Assignee: Hercules Incorporated, Wilmington, Del.

[21] Appl. No.: 262,190

[22] Filed: Jun. 20, 1994

[51] Int. Cl.$^6$ ............... B32B 9/04; C08K 5/54; C08K 5/01; C08F 283/12

[52] U.S. Cl. ............... 428/447; 528/31; 528/15; 528/27; 528/25; 528/26; 524/731; 524/770; 524/718; 524/862; 524/89; 524/268; 524/588; 524/81; 524/359

[58] Field of Search .................. 528/31, 15, 27, 528/25, 26; 524/731, 770, 718, 862, 359, 89, 81, 268, 588; 428/447

[56] References Cited

U.S. PATENT DOCUMENTS

| | | | |
|---|---|---|---|
| 2,590,493 | 3/1952 | Berberich et al. | 117/46 |
| 3,197,432 | 7/1965 | Lamoreaux | 260/46.5 |
| 3,197,433 | 7/1965 | Lamoreaux | 260/46.5 |
| 3,438,936 | 4/1969 | Lamoreaux | 260/46.5 |
| 4,657,965 | 4/1987 | Watanabe et al. | 524/506 |
| 4,728,346 | 3/1988 | Murphy | 55/158 |
| 4,780,510 | 10/1988 | Uemiya et al. | 525/326.5 |
| 4,837,401 | 6/1989 | Hirose et al. | 525/364 |
| 4,859,215 | 8/1989 | Langsam et al. | 55/16 |
| 4,877,820 | 10/1989 | Cowan | 523/222 |
| 4,900,779 | 2/1990 | Leibfried | 524/862 |
| 4,902,731 | 2/1990 | Leibfried | 523/222 |
| 4,978,731 | 12/1990 | Melancon et al. | 528/15 |
| 5,008,360 | 4/1991 | Bard et al. | 528/25 |
| 5,013,809 | 5/1991 | Leibfried, Sr. | 528/862 |
| 5,025,048 | 6/1991 | Burnier | 524/99 |
| 5,068,303 | 11/1991 | Bard et al. | 528/25 |
| 5,077,134 | 12/1991 | Leibfried, Sr. | 428/447 |
| 5,104,930 | 4/1992 | Rinde et al. | 524/871 |
| 5,118,735 | 6/1992 | Burnier | 524/99 |
| 5,147,945 | 9/1992 | Woodside | 528/475 |
| 5,171,817 | 12/1992 | Barnum et al. | 528/15 |
| 5,196,498 | 3/1993 | Leibfried et al. | 528/15 |
| 5,211,877 | 5/1993 | Andrejewski et al. | 252/299.01 |
| 5,242,979 | 9/1993 | Barnum et al. | 525/106 |
| 5,298,536 | 3/1994 | Babcock et al. | 523/201 |
| 5,340,644 | 8/1994 | Babcock et al. | 428/285 |

FOREIGN PATENT DOCUMENTS 1073248  2/1984  U.S.S.R. .

OTHER PUBLICATIONS

Mascia et al., "Viscoelasticity and Plasticity Aspects of Antiplasticization Phenomena: Strain Rate and Temperature Effects", J. Macromol. Sci.–phys. B26(2), pp. 237–256 (1987).
English Language Abstract of Soviet Patent No. 1,073,248. Vishnovskii et al., Chemical Abstract, No. 100:35245n, "Heat Resistance of Organosilicon Resins Containing Siloxarophenanthrene and Silafluorene Units".
Crivello et al., "Novel Platinum–Containing Initiators for Ring–Opening Polymerizations", Journal of Polymer Science: Part A: Polymer Chemistry, vol. 29, pp. 1853–1853 (1991).
Grulke, "Solubility Parameter Values", Polymer Handbook, VII, pp. 519–526 and 554.
Jackson et al., "Antiplasticization. II. Characteristics of Antiplasticizers", Journal of Applied Polymer Science, vol. 11, pp. 211–226 (1967).
Jackson et al. "Antiplasticzation. III. Characteristics and Properties of Antiplasticizable Polymers" Journal of Applied Polymer Science, vol. 11, pp. 227–244 (1967).
Makaruk et al. "The Formation and Dissociation of Networks Formed by Polymer–Plasticizer Interactions":, J. Polymer Science, Symposium No. 53, pp. 89–93 (1975).
Kryszewski et al., :"Antiplasticization of Polycarbonate Due to a Charge Transfer Complex and Its Components", Journal of Applied Science: Applied Polymer Symposium, 35, pp. 553–562 (1979).
Robertson et al., "Free Volume and the Annealing and Antiplasticizing of Bisphenol a Polycarbonate", Journal of Applied Science, vol. 16, pp. 733–738 (1972).
Robeson, "The Effect of Antiplasticization on Secondary Loss Transitions and Permeability of Polymers", Polymer Engineering and Science, vol. 9, No. 4, pp. 277–281 (1969).
Andrianov et al., "Some Physical Properties of Polyorganosiloxanes. I Linear Polyorganosiloxanes", Journal of Polymer Science: Part A–1, vol. 10, pp. 1–22 (1972).
Holliday et al., "Review: The Thermal Expansion of Composites Based on Polymers", Journal of Materials Science, vol. 8, pp. 301–311 (1973).
Barker, Jr., "An Approximate Relation Between Elastic Moduli and Thermal Expansivities", Journal of Applied Physics, vol. 34, No. 1, pp. 107–116 (Jan. 1963).
McLean et al., "Fortifiers for Epoxy–Amine Systems", British Polymer Journal, vol. 15, pp. 66–70 (1983).
Vrentas et al., "Antiplasticization and Volumetric Behavior in Glassy Polymers", Macromolecules, vol. 21 No. 5 pp. 1470–1475 (1988).

Primary Examiner—Margaret W. Glass
Attorney, Agent, or Firm—Robert P. O'Flynn O'Brien; Mark D. Kuller

[57] ABSTRACT

A reactive component, which is curable to form a nonpolar polymer containing silicon and carbon atoms, and having a glass transition temperature of at least 20° C., is mixed with an antiplasticizer. The resulting mixture, a curable composition, is cured to form a composition having an increased modulus. The reactive component preferably comprises a polyene having at least two hydrosilation reactive carbon-carbon double bonds (e.g., dicyclopentadiene), and a silicon compound having at least two hydrosilation reactive $\equiv$SiH groups. Preferably the silicon compound comprising at least one member selected from the group consisting of cyclic polysiloxanes, tetrahedral siloxysilanes, and linear polysiloxanes. Preferably the resulting cured composition is crosslinked, due to at least one member selected from the group consisting of the polyene and the silicon compound having more than two hydrosilation reactive sites. Preferably the curable composition further comprises a hydrosilation catalyst.

28 Claims, No Drawings

NONPOLAR POLYMERS COMPRISING ANTIPLASTICIZERS

BACKGROUND OF THE INVENTION

1. Field of the Invention

The present invention relates to compositions comprising antiplasticizers in combination with curable and cured organosilicon compositions, and to processes for preparing these compositions, and articles comprising these compositions.

2. Background and Relevant Information

LEIBFRIED '779, U.S. Pat. No. 4,900,779, LEIBFRIED '731, U.S. Pat. No. 4,902,731, LEIBFRIED '134, U.S. Pat. No. 5,077,134, and BARD et al. '360, U.S. Pat. No. 5,008,360, describe crosslinked organosilicon polymers and crosslinkable organosilicon prepolymers comprised of alternating polycyclic hydrocarbon residues and cyclic polysiloxanes or siloxysilane residues linked through carbon to silicon bonds; these patents are hereby incorporated by reference in their entireties. COWAN, U.S. Pat. No. 4,877,820, also hereby incorporated by reference in its entirety, discloses crosslinkable and crosslinked linear poly(organohydrosiloxane) prepolymers and polymers having at least 30% of their hydrosilation reactive ≡SiH groups reacted with hydrocarbon residues derived from polycyclic polyenes.

Antiplasticizers are substances which, when added to polymers or other materials, produce a composition having an increased modulus. For example, Jackson, W. J., Jr. and Caldwell, J. R., "Antiplasticization. III. Characteristics and Properties of Antiplasticizable Polymers", *Journal of Applied Polymer Science*, Vol. 11, pp 227–244 (1967), discloses that antiplasticization is applicable to polymers which contain rigid, polar groups and stiff chains, such as many bisphenol polycarbonates and polyesters.

Furthermore, substances which act as antiplasticizers in polar polymers have been added to nonpolar polymers. For example, U.S. Pat. No. 2,590,493, to BERBERICH et al., relates to flexible siliceous sheet materials comprising an organo-polysiloxane, to which is added a liquid isometric mixture of hydrogenated terphenyls, with the objective of providing a more resilient and more elastic composition. Further, the results disclosed in Table II indicate that the addition of the hydrogenated terphenyl increases the elongation (i.e., acts as a plasticizer) of the polysiloxane.

Furthermore, U.S. Pat. No. 4,780,510, to UEMIYA, et al., relates to cross-linked optical siloxane polymers, with the disclosed objective of providing a cross-linked optical siloxane polymer having a wide variety of refractive indexes, and/or a refractive index which is easily, widely and precisely modified. UEMIYA et al discloses the addition of a group onto a polysiloxane, such as styrene, o-methylstyrene, 2-vinylnaphthalene, 9-vinylanthracene, and perfluorooctylethylene, for modifying the refractive index of the polysiloxane. UEMIYA et al. states that a cross-linked optical siloxane polymer is an attractive optical material, since it has not only good processability but also good transparency and heat resistance, and a rubbery elasticity after being cured.

A Derwent English-language abstract of Soviet Union Patent No. 1073248 discloses compounds prepared by reacting N-allylcarbazole or 9-vinylanthracene with ethylhydridedichlorosilane in a molar ratio of 1:1.2–4, in the presence of chloroplatinic acid, at 95°–170° C., and hydrolysis at 65°–90° C. in toluene or dioxan. The compounds are disclosed as finding use as active components in electrophotographic layers, and as having a high electrophotosensitivity.

Chemical Abstracts 100:35245n ("Chemical Abstracts '245") is directed to heat resistance of organosilicon resins containing siloxarophenanthrene and silofluoroene units, and refers to a U.S.S.R. document identified as Vishnovskii, F. N., et al., "Heat Resistance of Organosilicon Resins Containing Siloxarophenanthrene and silafluorene Units", *Elektrotekh Prom-st., {Ser.}: Elektrotekh. Mater.*, (10), 3–5, 1983. This Chemical Abstract discloses increasing the heat resistance of siloxane resins by introducing phenanthrene and fluorene units into the polymer, with the highest heat resistance being obtained for siloxanes containing 60 mole percent phenanthrene units, and reports electrical properties of the modified resins comparable to those of poly(methylphenylsiloxane) MFVG-3 at 20° and 180°, as superior to those of MFVG-3 at 220°. The modified resins are disclosed as useful for impregnation of casings for electrical appliances.

SUMMARY OF THE INVENTION

It has been discovered that the incorporation of components which act as antiplasticizers—with crosslinkable prepolymers such as those discussed above, and in the preparation of crosslinked polymers, such as those discussed above, provides, to the cured compositions, mechanical properties that are superior to the properties which result when such components are not present. Among the improved mechanical properties is an increase in the modulus of the resulting composition.

The present invention relates to a novel composition comprising an antiplasticizer and a nonpolar glassy polymer, i.e., a nonpolar polymer having a glass transition temperature ($T_g$) of at least 20° C. Prior compositions have included antiplasticizers in combination with polar polymers, and nonpolar polymers having a $T_g$ below 20° C. in combination with a component which increases elongation, alters refractive index, or increases heat resistance of the low $T_g$ polymer.

In one embodiment, the present invention pertains to a curable composition, comprising a reactive component curable to form a nonpolar polymer, comprising silicon atoms and carbon atoms, and having a glass transition temperature of at least about 20° C., and an antiplasticizer in an amount effective to substantially increase the modulus of the polymer.

The reactive component preferably comprises: (1) a polyene having at least two hydrosilation reactive carbon-carbon double bonds, and a silicon compound having at least two hydrosilation reactive ≡SiH groups. The silicon compound preferably comprises at least one member selected from the group consisting of cyclic polysiloxanes, tetrahedral siloxysilanes (tetrakis [siloxysilanes]), and linear polysiloxanes, and/or (2) a crosslinkable organosilicon prepolymer hydrosilation reaction product of a polyene having at least two hydrosilation reactive carbon-carbon double bonds, and a silicon compound having at least two hydrosilation reactive ≡SiH groups, and comprising at least one member selected from the group consisting of cyclic polysiloxanes, tetrahedral siloxysilanes, and linear polysiloxanes. Preferably, at least one member selected from the group consisting of the polyene and the silicon compound has more than two hydrosilation reactive sites. Preferably, the polyene comprises a polycyclic polyene, preferably dicyclopentadiene. Preferably, the curable composition further comprises a hydrosilation catalyst.

Preferably the silicon compound comprises at least one member selected from the group consisting of:

(i) cyclic polysiloxanes having the formula:

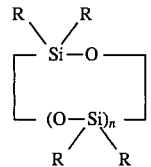

wherein R, which can be the same or different, is hydrogen, or a saturated, substituted, or unsubstituted alkyl or alkoxy radical, or a substituted or unsubstituted aromatic or aryloxy radical, n is an integer from 2 to about 20, and R is hydrogen on at least two of the silicon atoms;

(ii) tetrahedral siloxysilanes having the formula:

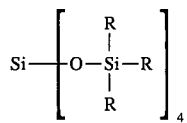

wherein R is as defined above, and is hydrogen on at least two silicon atoms in the molecule; and (iii) linear polysiloxanes having the formula:

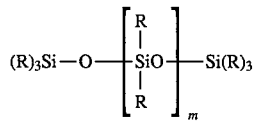

wherein R, which can be the same or different, is hydrogen, or a substituted or unsubstituted saturated alkyl radical, or a substituted or unsubstituted phenyl radical, at least two R's are hydrogen, and m is an integer from about 0 to 1000; and wherein the ratio of hydrosilation reactive carbon-carbon double bonds in the polyene to ≡SiH groups in the silicon compound is from about 0.1:1 to about 1.5:1.

Preferably, the antiplasticizer comprises at least one member selected from the group consisting of a substituted phenyl compound, an unsubstituted phenyl compound, a monocyclic aromatic compound, a polycyclic aromatic compound, an unsubstituted heterocyclic compound, a substituted heterocyclic compound, an unsubstituted homocyclic compound, and a substituted homocyclic compound, and, preferably, the antiplasticizer is substantially uniformly mixed with the reactive component. Still more preferably, the antiplasticizer comprises at least one member selected from the group consisting of o-terphenyl, m-terphenyl, fluorene, fluoranthene, hexaphenylcyclotrisiloxane, 2-vinylnaphthalene, 9-vinylanthracene, 4,4'-difluorobenzophenone, acenaphthylene, 9-vinyl carbazole, 4-vinyl biphenyl, and triphenylvinylsilane. Although in general the antiplasticizer is present in an amount effective to substantially increase the modulus of the polymer, preferably the antiplasticizer is present in an amount of from about 1 to 30 weight percent, based on the weight of the reactive component.

In a second embodiment, the present invention relates to a cured composition comprising a nonpolar polymer comprising silicon atoms and carbon atoms and having a glass transition temperature of at least about 20° C., and an antiplasticizer in an amount effective to substantially increase the modulus of the polymer. The nonpolar polymer is preferably crosslinked and preferably comprises repeating units derived from an organosilicon prepolymer comprising repeating units derived from a polyene and a silicon compound. Preferably, the polyene and the silicon compound are as described for the preferred curable composition of the present invention. Preferably, the nonpolar polymer is crosslinked, and further comprises a hydrosilation catalyst. Preferably, the antiplasticizer is as described for the preferred curable composition of the present invention. Preferably, the cured composition has a modulus at least 5% greater than the nonpolar polymer without the antiplasticizer.

In a third embodiment, the present invention pertains to a process for preparing the curable composition of the present invention, comprising mixing an antiplasticizer with a reactive component curable to form a nonpolar polymer comprising silicon atoms and carbon atoms and having a glass transition temperature of at least about 20° C. The antiplasticizer is mixed with the reactive component in an amount effective to substantially increase the modulus of the polymer. Preferred reactive components and antiplasticizers are as described for the curable composition of the present invention. A preferred reactive component comprises the crosslinkable organosilicon prepolymer hydrosilation product. Preferably, the process is carried out to form the preferred curable composition described above.

In a fourth embodiment, the present invention pertains to a process for preparing the cured composition of the present invention, comprising curing a curable composition comprising an antiplasticizer mixed with a reactive component curable to form a nonpolar polymer comprising silicon atoms and carbon atoms and having a glass transition temperature of at least about 20° C., the antiplasticizer being present in an amount effective to substantially increase the modulus of the polymer. Preferably, the process is carried out using the preferred reactive components and antiplasticizers, as described above, to form the preferred curable and cured compositions described above.

The present invention is also directed to a composite material comprising a matrix impregnated with a curable composition, said curable composition comprising a reactive component curable to form a nonpolar polymer comprising silicon atoms and carbon atoms and having a glass transition temperature of at least about 20° C.; and an antiplasticizer in an amount effective to substantially increase the modulus of the polymer.

It is an objective of the present invention to increase the modulus of a nonpolar polymer having a $T_g$ of at least 20° C., by the addition of an antiplasticizer thereto. It is especially advantageous to increase the modulus of copolymers of dicyclopentadiene and silicon compounds, such as siloxysilanes and polysiloxanes. Increasing the modulus of these relatively high $T_g$ nonpolar polymers is advantageous in structural applications such as space applications, where the extremely low water absorption and atomic oxygen resistance of hydrosilation resins is very desirable.

Although it has been discovered that the addition of antiplasticizers to nonpolar polymers increases the modulus of the resulting compositions, it was expected that the increase in modulus would be accompanied by a desirable decrease in the coefficient of thermal expansion (CTE) of the compositions, and it is one of the objectives of the present invention to provide such compositions exhibiting the combination of increased modulus and a decreased CTE. Of the various antiplasticizers investigated, it was unexpectedly found that some, but not all, of the antiplasticizers resulted in compositions having a modulus increase and a CTE decrease.

Furthermore, it is desirable to increase the polymer modulus and simultaneously increase the polymer glass transition temperature ($T_g$). However, it has been discovered that, for the majority of the antiplasticizers tested, the addition of the antiplasticizer to the nonpolar polymer results in a composition having a higher modulus together with a lower $T_g$, relative to an otherwise identical composition without the antiplasticizer. However, unexpectedly it has been found that at least one of the antiplasticizers tested (vinyl anthracene, at a level of 10 wt. %, based on the resin weight) results in compositions having a modulus increase in combination with an increased $T_g$, relative to an otherwise identical composition without the antiplasticizer.

Accordingly, the present invention is also directed to a curable composition, comprising a reactive component curable to form a polymer (polar or nonpolar) comprising silicon atoms and carbon atoms and having a glass transition temperature of at least about 20° C., and an antiplasticizer, preferably 9-vinylanthracene, in an amount effective to substantially increase the modulus of the polymer and increase the $T_g$ of the polymer.

DESCRIPTION OF THE INVENTION

The term "polyene," as used herein, refers to molecules having at least two carbon-carbon double bonds.

The term "polymer, " as used herein, may encompass prepolymers, such as crosslinkable prepolymers, and polymers, such as crosslinked polymers.

The term "prepolymer" as used herein, refers to any viscous liquid or solid hydrosilation crosslinkable composition that has been partially cured, but has not been cured up to or beyond its gel point (gel point is the point at which a material will no longer flow when heated, and is no longer soluble in organic solvents); typically, having 5% to 80% of the available ≡SiH groups reacted, and, in the case of the poly(organohydrosiloxane) prepolymers, as discussed hereinafter, up to 90% of such groups reacted.

The term "crosslinked polymer", as used herein, encompasses the products of curing hydrosilation crosslinkable compositions, as discussed above with reference to the term "prepolymer", up to or beyond such gel point. This term encompasses crosslinked polymers, as well as at least substantially crosslinked polymers.

The term "crosslinking", as used herein, particularly in the context of the process of the invention, encompasses the reaction of species with functionality greater than 2, to form a crosslinked polymer.

As used herein, the term "antiplasticizer" is defined as any substance which increases the modulus of a polymer with which it is in admixture and/or reacted with, while the polymer is below its $T_g$.

As used herein, the phrase "nonpolar polymer" is defined as any polymer exhibiting a solubility parameter of less than or equal to about 19 MPa$^{1/2}$. Solubility parameters for polymers are discussed in the *Polymer Handbook,* in Chapter VII, entitled "Solubility Parameter Values", authored by Eric A. Grulke.

The present invention is applicable to "glassy polymers", i.e., polymers having a $T_g$ of at least about 20° C. (without any additives therewith), in contrast to "rubbery polymers", which are polymers having a $T_g$ of less than about 20° C.

As used herein, the term "curing" refers to polymerization, either with or without crosslinking, and either with our without complete solvent removal. The polymerization reaction includes reactions among at least one member selected from the group consisting of monomers, oligomers, and prepolymers The "reactive component", as disclosed herein, comprises at least one member selected from the group of monomers, oligomers, and prepolymers, and is curable to form a nonpolar polymer comprising silicon and carbon atoms. The nonpolar polymer has a glass transition temperature of at least about 20° C.

The polyenes suitable for the invention include those having at least two hydrosilation reactive carbon-carbon double bonds. Preferred among such polyenes are the polycyclic polyenes, including those as disclosed in LEIBFRIED '779, LEIBFRIED '731, BARD et al. '360, and LEIBFRIED '809, U.S. Pat. No. 5,013,809, which are incorporated herein in their entireties, by reference thereto.

Particular appropriate polycyclic polyenes are polycyclic hydrocarbon compounds having at least two non-aromatic carbon-carbon double bonds in their rings. Exemplary compounds include cyclopentadiene oligomers (e.g., dicyclopentadiene, tricyclopentadiene, and tetracyclopentadiene), bicycloheptadiene (i.e., norbornadiene) and its Diels-Alder oligomers with cyclopentadiene (e.g., dimethanohexahydronaphthalene), norbornadiene dimer, hexahydronaphthalene, and substituted derivatives of any of these, e.g., methyl dicyclopentadienes. Dicyclopentadiene (also referred to herein as DCPD) is preferred. Two or more polycyclic polyenes can be used in combination.

The silicon compounds of the invention include those cyclic polysiloxanes, tetrahedral siloxysilanes, and linear polysiloxanes with two or more hydrogen atoms bound to silicon— particularly, with at least two hydrosilation reactive ≡SiH groups. Two or more suitable silicon compounds can be used in combination; particularly, one or more such cyclic polysiloxanes, and/or one or more such tetrahedral siloxysilanes, and/or one or more such linear polysiloxanes, may be employed.

Suitable such silicon compounds include those disclosed in LEIBFRIED '779, LEIBFRIED '731, LEIBFRIED '134, LEIBFRIED '809, COWAN, and BARD et al. '360, and in LAMOREAUX '432, U.S. Pat. No. 3,197,432, LAMOREAUX '433, U.S. Pat. No. 3,197,433, and LAMOREAUX '936, U.S. Pat. No. 3,438,936. These patents are incorporated herein in their entireties, by reference thereto.

Appropriate cyclic polysiloxanes include those having the general formula:

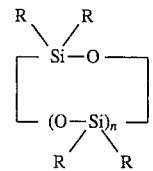

wherein R, which can be the same or different, is hydrogen, or a saturated, substituted, or unsubstituted alkyl or alkoxy radical, or a substituted or unsubstituted aromatic or aryloxy radical, n is an integer from 2 to about 20, and R is hydrogen on at least two of the silicon atoms in the molecule.

The methylhydrocyclosiloxanes (also referred to herein as MHCS), and mixtures thereof, are suitable such cyclic polysiloxanes. Examples include, e.g., tetraoctyl cyclotetrasiloxane, and hexamethyl cyclotetrasiloxane; tetra- and penta-methylcyclotetrasiloxanes; tetra-, penta-, hexa- and hepta-methylcyclopentasiloxanes; tetra-, penta- and hexamethyl-cyclohexasiloxanes, tetraethyl cyclotetrasiloxanes, and tetraphenyl cyclotetrasiloxanes. Preferred are 1,3,5,7-tetramethylcyclotetra-siloxane, 1,3,5,7,9-pentamethylcyclopentasiloxane, and 1,3,5,7,9,11-hexamethylcyclohexasiloxane, or blends thereof.

Most preferably, the silicon compound comprises a plurality of methylhydrocyclosiloxanes. Specifically, in a majority of cases, what is used is indeed a mixture of a number of species wherein n can vary widely, and reference hereinafter to MHCS can refer to such a mixture.

Generally, commercial MHCS mixtures contain up to about 20% (in purer forms, as low as 2%) low molecular weight linear methylhydrosiloxanes, such as heptamethyltrisiloxane, octamethyltetrasiloxane, etc. One suitable commercial mixture is Huls M8830 MHCS, available from Huls America, formerly Petrarch, Bristol, Pa.

The tetrahedral siloxysilanes are represented by the general formula:

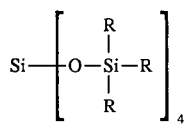

wherein R is as defined above, and is hydrogen on at least two silicon atoms in the molecule.

Examples include, e.g., tetrakisdimethylsiloxysilane, tetrakisdiphenylsiloxysilane, and tetrakisdiethylsiloxysilane. Tetrakisdimethylsiloxysilane is the best known and preferred species in this group.

Appropriate linear polysiloxanes include those having the general formula:

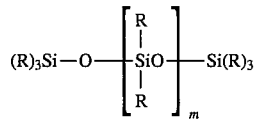

wherein R, which can be the same or different, is hydrogen, or a substituted or unsubstituted saturated alkyl radical, or a substituted or unsubstituted phenyl radical, at least two R's are hydrogen, and m is an integer from about 0 to 1000.

Suitable such linear polysiloxanes include the linear, short chain ≡SiH terminated polysiloxanes having the general formula:

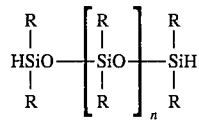

wherein n is 0 to 1000 and R is alkyl or aryl, preferably methyl or phenyl, as disclosed in LEIBFRIED '134 and LEIBFRIED '809.

These linear, short chain ≡SiH terminated polysiloxanes impart flexibility to the cured compositions, and can be used to produce elastomers. As examples of such polysiloxanes, disiloxanes, trisiloxanes, and other short siloxane oligomers, such as hexamethyltrisiloxane, are useful to lower viscosity, particularly for transfer molding operations where low viscosity is most desirable.

Yet additional suitable linear polysiloxanes are the linear poly(organohydrosiloxanes), having the general formula:

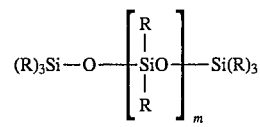

wherein R is a substituted or unsubstituted saturated alkyl radical or a substituted or unsubstituted phenyl radical, and from about 1% to 50%, or more preferably from about 5% to 50%, of the R's are hydrogen, and m is an integer from about 5 to 1000, preferably from about 3 to 100, and more preferably from about 5 to 100, and the maximum value of m is preferably about 60.

Exemplary linear poly(organohydrosiloxanes) include:
trimethylsiloxy-terminated methylhydropolysiloxane;
trimethylsiloxy-terminated dimethylsiloxanemethylhydrosiloxane copolymer,
dimethylsiloxy-terminated dimethylsiloxanemethylhydrosiloxane copolymer,
dimethylsiloxy-terminated polydimethylsiloxane,
trimethylsiloxy-terminated methyloctylsiloxanemethylhydro-siloxane copolymer,
dimethylsiloxy-terminated phenylmethylsiloxanemethylhydro-siloxane copolymer,
trimethylsiloxy-terminated methylcyanopropyl-siloxanemethylhydrosiloxane copolymer,
trimethylsiloxy-terminated 3,3,3-trifluoropropylmethylsiloxane methylhydrosiloxane copolymer,
trimethylsiloxy-terminated 3-aminopropylmethyl siloxanemethylhydrosiloxane copolymer,
trimethylsiloxy-terminated 2-phenylethylmethyl siloxanemethylhydrosiloxane copolymer, and
trimethylsiloxy-terminated 2-(4-methylphenyl)ethylmethylsiloxane-methylhydrosiloxane copolymer.

Poly(organohydrosiloxanes) which may be used include those as disclosed in COWAN.

A hydrosilation catalyst is preferably provided in the curable composition of the present invention, for effecting the cure thereof, to obtain the cured composition of the present invention. Such catalyst is preferably provided in an amount of about 20–60 parts per million ("ppm"), based on the total weight of the curable blend.

The hydrosilation catalysts include metal salts and complexes of Group VIII elements. The preferred hydrosilation catalysts contain platinum (e.g., $PtCl_2$, dibenzonitrile platinum dichloride, platinum on carbon, etc.).

One such platinum catalyst which is suitable, in terms of both reactivity and cost, is chloroplatinic acid ($H_2PtCl_6.6H_2O$); also appropriate are the platinum complex of divinyltetramethyldi-siloxane, available as PC075 from Huls America, and the platinum-containing catalysts PC072 (a platinum divinyl complex) and PC085, also available from Huls America. One preferred catalyst is a complex of chloroplatinic acid and dicyclopentadiene, as disclosed, for instance, in LEIBFRIED '779, and in BARD et al. '360.

Also suitable, as hydrosilation catalysts for curable blends of the invention, are those as disclosed in CRIVELLO et al., "Novel Platinum-Containing Initiators for Ring-Opening Polymerizations", *Journal of Polymer Science: Part A: Polymer Chemistry*, Vol.29, pages 1853–1863 (1991); this article is incorporated herein in its entirety, by reference thereto.

The antiplasticizers useful in the present invention include all compounds which, when present in uniform admixture with a polymer (and/or reacted with the polymer) fill in free volume and thereby prevent rotation around bonds, etc., which causes the modulus (i.e., stiffness) of the polymer to increase. Preferably, the antiplasticizer comprises at least one member selected from the group consisting of a substituted phenyl compound, a monocyclic aromatic compound, a polycyclic aromatic compound, an unsubstituted heterocyclic compound, a substituted heterocyclic compound, an unsubstituted homocyclic compound, and a substituted homocyclic compound. More preferably, the antiplasticizer comprises at least one member selected from the group consisting of o-terphenyl, m-terphenyl, fluorene, fluoranthene, hexaphenylcyclotrisiloxane, 2-vinyl naphthalene, 9-vinylanthracene, 4,4'-difluorobenzophenone, acenaphthylene, 9-vinyl carbazole, 4-vinyl biphenyl and triphenylvinylsilane. Still more preferably, the antiplasticizer comprises at least one member selected from the group consisting of o-terphenyl, 2-vinyl naphthalene, 9-vinylanthracene, acenaphthylene, 9-vinyl carbazole, and 4-vinyl biphenyl. 9-Vinylanthracene is the most preferred antiplasticizer for the purpose of increasing modulus while also increasing $T_g$.

The antiplasticizer may be nonreactive, thus being present in admixture with the remaining components in the curable composition or cured composition. On the other hand, the antiplasticizer may be reactive with the polymer or the reactive component(s) either before, during, or after the curing of the curable composition to form the cured composition. The degree of reactivity of the antiplasticizer can vary from no reactivity with the polymer to substantially complete reactivity with the polymer (i.e., substantially no antiplasticizer remaining unreacted with the polymer).

The antiplasticizer is present in an amount effective to substantially increase the modulus of the nonpolar polymer. A substantial increase in the modulus of the nonpolar polymer is herein defined as a modulus increase of at least about 5% over the modulus of the nonpolar polymer without any modulus-increasing additives admixed therewith and/or reacted thereto. In general, the nonpolar polymer modulus increase achieved according to the present invention is at least about 5%, more preferably at least about 10%, and is most preferably at least about 20%.

In order to substantially increase the modulus of the polymer, the antiplasticizer is, in general, present in an amount of from about 1 to 30 weight percent, based on the weight of the reactive component in the curable composition of the present invention, or based on the weight of the nonpolar polymer, in the cured composition of the present invention. Preferably, the antiplasticizer is present in an amount of from about 5 to 20 weight percent, and still more preferably, the antiplasticizer is present in an amount of from about 5 to 15 weight percent.

The cured and curable compositions of the present invention are prepared by mixing (i.e., blending) the antiplasticizer with the reactive component which is curable to form a nonpolar polymer. Such curable blends can be mixed together using any suitable means, such as conventional mixing and blending apparatuses (mixers, blenders, etc.). In the cured and curable compositions of the present invention, the antiplasticizer and reactive component are preferably mixed together to a degree of substantially uniformly, in the preparation of the cured and curable composition.

Curing of the curable composition is preferably effected thermally. As one suitable method, the curable blend is degassed under vacuum, followed by heating in an inert atmosphere, e.g., under nitrogen. Curing effects hydrosilation of carbon-carbon double bonds and ≡SiH groups. Where polyene and silicon compound are the starting materials, the reaction will proceed through, if continued for a sufficient amount of time, to the crosslinked polymer; where it is the crosslinkable prepolymer which is employed, it is the as yet unreacted carbon-carbon double bonds and ≡SiH groups thereof which undergo hydrosilation, with the result being further conversion, of the prepolymer, to a crosslinked polymer.

The curable composition may optionally further comprise a catalyst (as discussed above) together with the antiplasticizer and the reactants, i.e., the polyene and the silicon compound, as well as any additional components which may be used, such as reinforcing agents (e.g., fibers), fillers, antioxidants, flame retardants, elastomers, pigments, reaction rate modifiers, other monomers, oligomers, or prepolymers, and/or polymers. These additional components can be suitably blended, then subjected to the curing procedure (as described above), in the preparation of the cured product of the present invention.

The reactive component in the curable composition may comprise a prepolymer (as discussed above), and still more preferably, a crosslinkable prepolymer, and more preferably, a crosslinkable organosilicon prepolymer. In a particularly preferred embodiment of the curable composition of the present invention, the polyene and silicon compound are provided in the form of the indicated crosslinkable organosilicon prepolymer, prepared by hydrosilation from reactants comprising a polyene and a silicon compound. This curable prepolymer may then be further combined with a platinum catalyst and an antiplasticizer, and may further comprise additional components, for example, reinforcing agents, etc., as discussed further below. All of these components can be present during the curing step.

In the preparation and curing of curable compositions comprising a prepolymer, the same hydrosilation catalysts as previously discussed for the polymerization of the polyene and the silicon compound, are generally suitable for carrying out the curing step. If a sufficient amount of the hydrosilation catalyst is used in the preparation of the prepolymer, the continuing presence of the hydrosilation catalyst in the resulting curable composition can be adequate to effect curing of the prepolymer, without requiring further addition of hydrosilation catalyst. Alternatively, if necessary, the curable composition can be provided with additional hydrosilation catalyst.

The crosslinkable organosilicon prepolymers suitable for the invention include those prepolymers as disclosed in LEIBFRIED '779, LEIBFRIED '731, LEIBFRIED '134, BARD et al. '360, and COWAN. The crosslinkable prepolymers suitable for the invention also include those prepolymers as disclosed in BARD et al. '303, U.S. Pat. No. 5,068,303, BURNIER '048, U.S. Pat. No. 5,025,048, BURNIER '735, U.S. Pat. No. 5,118,735, BARNUM et al. '817, U.S. Pat. No. 5,171,817, U.S. Pat. No. 5,242,979, BARNUM et al. '979 and U.S. Pat. No. 5,196,498, LEIBFRIED '498; these patents are incorporated herein in their entireties, by reference thereto.

Preferred crosslinkable organosilicon prepolymers are those comprising:

(a) at least one polyene having at least two hydrosilation reactive carbon-carbon double bonds; and (b) at least one silicon compound, having at least two hydrosilation reactive ≡SiH groups, and comprising at least one member selected from the group consisting of cyclic polysiloxanes, tetrahedral siloxysilanes, and linear polysiloxanes;

wherein at least one member, selected from the group consisting of the polyene and the silicon compound, has more than two hydrosilation reactive sites. Most preferably, the silicon compound has three or more hydrosilation reactive ≡SiH groups.

Suitable polyenes and silicon compounds for preparing prepolymers include the polyenes and silicon compounds discussed herein. Preferred prepolymers include crosslinkable prepolymers comprising at least one polyene, and one or more one cyclic polysiloxanes, and/or tetrahedral siloxysilanes, and/or linear polysiloxanes, as discussed above. Preferably, the ratio of total hydrosilation reactive carbon-carbon double bonds of the polyene, to total hydrosilation reactive ≡SiH groups of the silicon compound, is from about 0.1:1 to 1.5:1; more preferably, this ratio is from about 0.5:1 to 1.2:1; still more preferably, this ratio is from about 0.8:1 to 1.2:1. Most preferably, this ratio is about 1:1.

Preferred crosslinkable organosilicon prepolymers for use in the present invention, include linear poly (organohydrosiloxane) prepolymers, and linear poly(organohydrosiloxane) prepolymers in which hydrosilation reactive ≡SiH groups having been reacted with a polyene, preferably a polycyclic polyene. Suitable polyenes, such as polycyclic polyenes, include those as discussed herein.

In these crosslinkable linear poly(organohydrosiloxane) prepolymers, preferably from about 5% to 90%, more preferably from about 30% to 90%, and, most preferably from about 30% to 60%, of the hydrosilation reactive ≡SiH groups are reacted with a polyene. Appropriate linear poly-(organohydrosiloxanes) for these prepolymers are those as discussed herein, with both the general formula, and the exemplary linear poly (organohydrosiloxanes), being applicable.

The crosslinkable prepolymers of the invention can be prepared utilizing the procedures and components, including, but not limited to, process steps and catalysts, as set forth in LEIBFRIED '779, LEIBFRIED '731, LEIBFRIED '134, BARD et al. '360, BARD et al. '303, BURNIER '048, BURNIER '735, COWAN, and BARNUM et al. '817, U.S. Pat. No. 5,292,979 BARNUM et al. '979. The reactions for forming the prepolymer can be promoted thermally, and/or by the addition of a hydrosilation catalyst or radical generators such as peroxides and azo compounds.

With respect to hydrosilation catalysts, those disclosed herein for use with the curable blends of the invention, in effecting the cure thereof, are likewise suitable for use in preparation of the prepolymer. For platinum catalysts, concentrations of about 0.0005 to about 0.05% by weight of platinum, based on the weight of the monomers, are preferred.

One approach for preparing a crosslinkable organosilicon prepolymer as previously discussed, is simply to mix the correct relative ratios of components, i.e., including the polyene, silicon compound, and platinum catalyst, and thereafter bring the mixture to a temperature at which the reaction is initiated. Proper temperature conditions are thereafter maintained, to drive the reaction to the degree of completion required for obtaining the desired prepolymer.

In this regard, reaction conditions utilized are those which result in a prepolymer, within the meaning of the term as defined herein, i.e., such polymer being partially cured, but not cured up to or beyond its gel point. For instance, the mixture of the components is maintained at about 30° to 65° C., for several hours, then interrupted at the point where the requisite proportion of available hydrosilation reactive ≡SiH groups have been reacted—preferably from about 5% to 80% thereof. More preferably, this polymerization is effected so that from about 30% to 65%, and most preferably from about 30% to 50%, of available hydrosilation reactive ≡SiH groups have been reacted.

The indicated preparation of prepolymer can be conducted as a two stage procedure. In such instance, the polyene used to prepare the prepolymer is itself first prepared in the same manner as the prepolymer. In this regard, such polyene is obtained by carrying out a hydrosilation reaction by heating a mixture of platinum catalyst, silicon compound, and an "initial polyene", which may comprise one or more of those polyenes discussed herein being suitable as such initial polyene. This reaction produces a "resulting polyene", which is preferably used in the preparation of the prepolymer. More specifically, the resulting polyene can be prepared in the manner as set forth in LEIBFRIED '134 and LEIBFRIED '809.

For the preparation of the resulting polyene, the relative proportions of initial polyene and silicon compound employed are such that a large excess of hydrosilation reactive carbon-carbon double bonds are available for reaction with the hydrosilation reactive ≡SiH groups. That is, the ratio of hydrosilation reactive carbon-carbon double bonds of initial polyene, to hydrosilation reactive ≡SiH groups of silicon compound, is between about 2:1 and about 10:1. Excess initial polyene which remains after this reaction is removed by any suitable method, such as conventional stripping, e.g., by distillation under vacuum.

In the resulting polyene, the ratio of total hydrosilation reactive carbon-carbon double bonds, contributed thereto by the initial polyene, to hydrosilation reactive ≡SiH groups, contributed thereto by the silicon compound, is preferably at least about 1.8:1; more preferably, greater than about 1.8:1. Still, more preferably, this ratio is from about 1.8:1 to 2.2:1; most preferably, from about 1.8:1 to about 2.0:1.

In the formation of this resulting polyene, the hydrosilation reactive ≡SiH groups, which have been contributed thereto by the silicon compound, are fully, or at least substantially fully, reacted with the hydrosilation-reactive carbon-carbon double bonds which have likewise been contributed by the initial polyene.

As to such hydrosilation-reactive carbon-carbon double bonds contributed by the initial polyene, those which have not been reacted with the indicated ≡SiH groups, are available for further hydrosilation. The resulting polyene is accordingly provided with at least two hydrosilation-reactive, carbon-carbon double bonds.

The resulting polyene can accordingly be used in preparation of the prepolymer, for such curable blends of the invention which incorporate prepolymer. Additionally, the resulting polyene is likewise suitable as the polyene, for curable blends of the invention where the prepolymer is not employed.

Of those hydrosilation reactive carbon-carbon double bonds contributed but not reacted with the ≡SiH groups, such hydrosilation reactive carbon-carbon double bonds which are part of the initial polyene, which, in turn, is now part of the resulting polyene, will accordingly be available for reaction with hydrosilation reactive ≡SiH groups of further silicon compound, in the second stage of the indicated two stage procedure. This second stage is preparation of the crosslinkable prepolymer, and can be conducted, with the resulting polyene, and a further silicon compound, in the manner for preparing a crosslinkable organosilicon prepolymer, as previously discussed.

As to such two stage prepolymer, the ratio of total hydrosilation reactive carbon-carbon double bonds, contributed thereto by such resulting polyene, to hydrosilation reactive ≡SiH groups, contributed thereto by such further silicon compound, will preferably also be the same as previously discussed, with respect to preparation of crosslinkable organosilicon prepolymer, i.e., preferably from about 0.1:1 to 1.5:1; more preferably, from about 0.5:1 to 1.2:1; still more preferably, from about 0.8:1 to 1.2:1; most preferably about 1:1.

Particularly as to preparing the crosslinkable linear poly-(organohydrosiloxane) prepolymer of the invention, as discussed herein, platinum catalyst and polycyclic polyene are mixed and heated to form a complex. This complex and the poly(organohydro-siloxane) are thereafter combined, and, as with the previously discussed organosilicon prepolymer, suitable reaction conditions are utilized to obtain the requisite prepolymer.

Particularly, the reaction mixture is heated to a temperature of from about 40° to 65° C., as previously discussed with reference to preparation of the organosilicon crosslinkable prepolymer. The reaction temperature is maintained for several hours, then interrupted at the point where the requisite proportion of available hydrosilation reactive ≡SiH groups have been reacted, preferably, for this poly(organohydro-siloxane) prepolymer, 5% to 90% thereof. More preferably, the polymerization is effected so that from about 30% to 60%, of such available hydrosilation reactive ≡SiH groups, have been reacted.

As to the following discussion of suitable polycyclic polyenes for obtaining the requisite poly(organohydro-siloxane) prepolymer, from the indicated lower temperature reaction, such discussion is provided according to the best understanding of this matter at the present. This discussion is not intended to limit the scope of the invention.

Specifically, so that the requisite poly(organohydro-siloxane) prepolymer, preferably being flowable and heat curable, can be obtained from such lower temperature reaction, even though the ratio of hydrosilation reactive carbon-carbon double bonds to hydrosilation reactive ≡SiH groups is otherwise suitable for obtaining the crosslinked polymer, it appears that an appropriate polycyclic polyene is required. Suitable such polycyclic polyenes are those having chemically distinguishable hydrosilation reactive carbon-carbon double bonds, i.e., one such bond being more reactive during hydrosilation than the other (more strained, and/or more "electron-rich", and/or less hindered). These polycyclic polyenes include, for example, cyclopentadiene oligomers such as dicyclopentadiene and cyclopentadiene trimer, and methyl dicyclopentadiene.

Yet further components, other than those previously specified, may be included in the invention; such components may be provided to the curable blends of the invention, and/or, where a prepolymer is employed, in preparation of such prepolymer, depending upon the properties of the components and prepolymer. Further as to such additional components, it is understood that those particular additional components, which are specifically discussed, are not provided by way of limitation, and that yet others, not specifically described, may also be suitable.

For instance, what is identified, in the above-referenced U.S. Pat. No. 5,196,498, Leibfried '498, as the at least one second silicon compound, is a suitable such additional component. This component is particularly noted as one which can be provided to curable blends of the invention as a starting material, and/or employed in preparation of prepolymer.

Other yet additional further components include reaction rate modifiers, as disclosed in the above-referenced U.S. Pat. No. 5,340,644 Babcock et al. '644, incorporated herein in its entirety by reference thereto.

Still additional further components include flame retardants, as disclosed in U.S. Pat. No. 5,298,536, Babcock et al. '536, which is incorporated herein in its entirety, by reference thereto.

As yet further examples of additional components, carbon (graphite), quartz, aramid, and other polymeric fibers may be included in the curable blends of the invention; these materials are wetted very well by the liquid prepolymers of the invention, making them excellent matrix materials. Fiber can be in non-woven, unidirectional, woven, fabric, etc., form; suitable fibers and prepregs include those as discussed in BARD '360.

Additives such as fillers and pigments are also readily incorporated. Vermiculite, mica, wollastonite, calcium carbonate, sand, silica, fumed silica, fused silica, ceramic beads, hollow glass, glass spheres, glass beads, ground glass, waste glass and other mineral fillers are examples of fillers which can be incorporated. Fillers can serve either as reinforcement or as fillers and extenders to reduce the cost of the molded product; glass spheres, in particular, are useful for preparing low density composites. Fillers can also be used for other reasons, such as viscosity modification. Fillers can be present in amounts up to about 15% by weight of the curable blends of the invention, and in even higher amounts, i.e., up to about 90% by weight, when glass fibers are not used.

Stabilizers (anti-oxidants) are useful to maintain storage stability of the prepolymers, in curable blends of the invention, and thermal oxidative stability, of the finally cured products. Examples include bis(1,2,2,6,6-pentamethyl-4-piperidinyl)-(3,5-di-tert-butyl-4 -hydroxybenzyl)butylpropanedioate (available as Tinuvin™ 144 from Ciba-Geigy Corp., Hawthorne, N.Y.), or a combination of octadecyl 3,5-di-tert-butyl-4-hydroxyhydrocinnamate (also known as octadecyl 3-(3',5'-di-tert-butyl-4'-hydroxyphenyl) propionate) (available as Naugard™ 76 from Uniroyal Chemical Co., Middlebury, Conn.) and bis(1,2,2,6,6-pentamethyl-4-piperidinyl-sebacate) (available as Tinuvin™ 765 from Ciba-Geigy Corp.). Stabilizers are generally used in an amount of about 0.5% to about 3.0%, based on the weight of the prepolymer of the curable blend. Generally, the stabilizers can be employed as disclosed in BURNIER '048, and in BURNIER '735.

One or more elastomers can also be added to improve toughness. Preferred are hydrocarbon elastomers having a molecular weight of less than 100,000 and low molecular weight siloxane elastomers. Exemplary hydrocarbon elastomers are low molecular weight ethylene-propylene-diene terpolymers, low molecular weight butyl rubber, partially hydrogenated low molecular weight polyisoprene or natural rubber, and partially hydrogenated low molecular weight polybutadiene or styrene-butadiene copolymers. Exemplary siloxane rubbers include low molecular weight vinyl or SiH terminated polydimethyl/diphenyl siloxane copolymers. Preferred are low molecular weight ethylene-propylene-dicyclopentadiene and ethylene-propylene-ethylidenenorbornene polymers having a molecular weight of 5500 to 7000. Most preferred is Trilene 65 elastomer (available from Uniroyal Chemical Co.). The elastomer or elastomers are generally used in an amount of 0.5 to 20%, preferably 3 to 12%, and most preferably 5 to 10%, by weight of the total composition; higher levels may be useful in some applications. Generally, elastomers can be employed as disclosed in BARNUM et al. '817, and in U.S. Pat. No. 5,242,979.

Generally as to the relative proportions and different types of components used in preparing the curable and cured compositions of the invention, these can be determined without undue experimentation, by those of ordinary skill in the art, according to a variety of factors. Such factors include, but are not limited to, the compatibility of such components, whether they will react with one another, and, in the event that they react with one another, the stoichiometry of the reactions which occur. Still additional factors concern the properties desired in the curable composition and cured composition of the present invention.

In this regard, one set of proportions to consider is the ratio of total hydrosilation reactive carbon-carbon double bonds, to total hydrosilation reactive ≡SiH groups, ultimately contributed from all sources, e.g., polyene, silicon compound, and antiplasticizer, in preparing the compositions of the invention, whether contributed to preparation of the prepolymer, or to the final, cured product. As discussed above, this ratio is preferably from about 0.1:1 to 1.5:1; more preferably, from about 0.5:1 to 1.2:1; still more preferably, from about 0.8:1 to 1.2:1. Most preferably, this ratio is about 1:1.

Where prepolymer is employed, such prepolymer and the antiplasticizer, may be used in any relative proportions which will allow the cured composition of the invention to be obtained. Preferably, such prepolymer and antiplasticizer are employed in any relative proportions in which they can be mixed to form a substantially uniform mixture or solution.

The cured composition of the present invention has utility in a variety of application, including, for example, electronic applications, composites (especially planarizing resins for aerospace applications involving low earth orbit), adhesives, encapsulants, potting compounds, and coatings. The cured composition of the present invention is especially useful for the preparation of prepregs and laminates, such as those used for printed circuit boards, and glob top encapsulants and molding compounds for encapsulation.

For preparing prepregs and laminates, utilizing compositions of the invention, procedures as disclosed in BARD et al. '360,and U.S. Pat. No. 5,340,644, which are incorporated herein in their entireties, by reference thereto.

With respect to preparation of prepregs, utilizing curable blends of the invention provided with prepolymer as a starting material, a suitable procedure includes forming the prepreg by impregnating a matrix such as reinforcement fibers (e.g., glass fabric) with the curable blend, or pouring the curable blend over such reinforcement. Then, preferably, the thusly treated reinforcement is cured to the point where the blend of the invention is substantially solid, and, most preferably, also at least substantially tack free; however, prepregs thusly obtained, but which are not tack free, are also within the scope of the invention.

Where the curable blend of the invention utilizes polyene and silicon compound, instead of, or in addition to, prepolymer prepared therefrom, the blend is first partially cured, to obtain a liquid (preferably viscous), semisolid, or solid composition. It is this composition which is thusly employed with the reinforcement, with prepreg preparation otherwise being effected according to the procedure set forth above.

In a suitable procedure for obtaining laminates, individual plies of prepregs are stacked, and laminated under heat and pressure, in a hydraulic press. Further cure, of the blend of the invention, is obtained in this treatment.

The invention is illustrated by the following Examples, which are provided for the purpose of representation, and are not to be construed as limiting the scope of the invention. Unless stated otherwise, all percentages, parts, etc. are by weight.

EXAMPLES 1–14

The following procedure is carried out in preparing the antiplasticized polymers of Examples 1–14.

Into a 4 ounce glass jar, with a lid, weighed quantities of the following are added:

(a) methylhydrocyclosiloxane (MHCS), obtained from General Electric of Waterford, N.Y.;

(b) Naugard™ 76, an antioxidant obtainable from Uniroyal Chemical Co. of Middlebury, Conn.;

(c) Tinuvin™ 765, an antioxidant obtainable from Ciba-Geigy Corp., of Hawthorne, N.Y.;

(d) an antiplasticizer, as identified in Table 1, obtainable from Aldrich Chemical, Petrarch Chemical, or Hüls America of Piscataway, N.J.;

(e) a mixture of dicyclopentadiene with cyclopentadiene trimer, obtainable from Maruzen Petrochemical of Tokyo, Japan.

The various quantities of (a)–(e) for Examples 1–14 are set forth in Table A, below.

TABLE A

| Ex. | MHCS grams | Naugard 76 (grams) | Tinuvin 765 (grams) | Antiplasticizer (grams) | DCPD/ trimer (grams) |
|---|---|---|---|---|---|
| 1 | 13.14 | 0.55 | 0.11 | 0 | 15.61 |
| 2 | 20.74 | 0.91 | 0.19 | 2.5 (O-terphenyl) | 25.23 |
| 3 | 19.62 | 0.91 | 0.19 | 5.0 (O-terphenyl) | 23.85 |
| 4 | 18.5 | 0.91 | 0.19 | 7.5 (O-terphenyl) | 22.47 |
| 5 | 17.64 | 0.91 | 0.19 | 10.0 (O-terphenyl) | 21.07 |
| 6 | 20.74 | 0.91 | 0.19 | 2.5 (M-terphenyl) | 25.23 |
| 7 | 19.62 | 0.91 | 0.19 | 5.0 (M-terphenyl) | 23.85 |
| 8 | 18.5 | 0.91 | 0.19 | 7.5 (M-terphenyl) | 22.47 |
| 9 | 17.64 | 0.91 | 0.19 | 10 (M-terphenyl) | 21.07 |
| 10 | 19.62 | 0.91 | 0.19 | 5.0 fluorene | 23.85 |
| 11 | 19.78 | 0.91 | 0.19 | 5.0 fluoranthene | 23.69 |
| 12 | 20.74 | 0.91 | 0.19 | 2.5 hexaphenylcyclotrisiloxane | 25.23 |
| 13 | 19.62 | 0.91 | 0.19 | 5.0 hexaphenylcyclotrisiloxane | 23.85 |
| 14 | 18.5 | 0.91 | 0.19 | 7.5 hexaphenylcyclotrisiloxane | 22.47 |

The order of addition of the components makes no difference in the result obtained. Upon mixing these components (all of which are liquids, with the exception of the Naugard™ 76) to substantial uniformity, a solution is formed, and is mixed until all of the Naugard™ 76 is dissolved. Then, for the preparation of each resin in each of Examples 1–14, forty parts per million of catalyst (chloroplatinic acid in dicyclopentadiene), is injected into the glass jar. The jar is placed in a room temperature (24°–25° C.) water bath and is stirred for 17–20 hours. If the resin does not exotherm during this time period, the water bath is heated to 35°–40° C. Once the resin exotherms, a gel time at 130° C. is determined. If the resin gels within 5–6 minutes at 130° C., no additional catalyst is necessary. However, if the gel time at 130° C. is greater than 6 minutes, additional catalyst in the form of PC075 in toluene is added. [PC075 is a platinum catalyst obtained from Hüls America Inc., of Piscataway, N.J.] Once the appropriate gel time at 130° C. is obtained, the resin is degassed in a 70° C. vacuum oven for 30–60 minutes, depending upon the viscosity of the resin. The resin is then transferred into a preheated 70° C. aluminum mold, measuring 5½"×5½"×⅛". The aluminum mold is placed back into the 70° C. oven and is sent through the following cure cycle:

2° per minute to 170° C., and held at 170° C. for 2 hours; then

2° per minute to 220° C., and held at 220° C. for 4 hours; then

2° C. per minute to room temperature.

A nitrogen line is attached to the vacuum oven. Nitrogen is vented through the oven after the resin gels and prior to reaching 200° C. Gelation of the resin is determined by poking the resin with a wooden applicator stick. If the resin is hard, gellation has occurred. Once the oven cure is complete, the resin is removed from the aluminum mold as a cured plaque, and prepared for analytical testing.

The cured plaque is cut into four 2½"×½"×⅛" rectangular bars and submitted for a room temperature modulus determination. The modulus determination is conducted at 24°–25° C. at a frequency of 10 radians per second on a Rheometrics dynamic mechanical spectrometer (model 605, obtainable from Rheometrics Inc. of Piscataway, N.J.). The plaque is also cut into ¼"×¼"×⅛" pieces for thermomechanical analysis. The resulting thermal coefficient of expansion (TCE) values, provided in Table 1, are determined on the first heat in the temperature range of 5° C.–50° C.

4,4'-difluorobenzophenone, acenaphthylene, 9-vinyl carbazole, 4-vinyl biphenyl, and triphenylvinylsilane. The 2-vinyl naphthalene, 9-vinyl anthracene, 4,4'-difluorobenzophenone, acenaphthylene, 9-vinyl carbazole, and 4-vinyl biphenyl are obtainable from Aldrich of Milwaukee, Wis. The triphenylvinylsilane can be obtained from Hüls America Inc., of Piscataway, N.J.

A dicyclopentadiene/methylhydrocyclosiloxane prepolymer is prepared via an addition method. A typical method is as follows. A catalyst concentrate is prepared by mixing 1.51 g chloroplatinic acid (Engelhard, Iselin, N.J.) 146.74 g DCPD, then heating the mixture at 70° C. for one hour and 15 minutes in an oil bath. The mixture is then cooled slowly to room temperature.

In an 8 ounce pop bottle is mixed 107.09 g DCPD, 1.39 g catalyst concentrate (from above), and 54.35 g toluene to form the B-side. The mixture is heated at 50° C. for one hour and then added to a 250 ml addition funnel.

In a 500 ml 3-neck flask with condenser is added 0.65 g Tinuvin™ 765 (Ciba-Geigy, Hawthorne, N.Y.), 3.19 g Naugard™ 76 (Uniroyal, Middlebury, Conn.), and 104.46 g MHCS (GE, Waterford, N.Y.) to form the A-side. The mixture is heated to 70° C.

B-side is dripped into the A-side while maintaining the temperature in the flask at 70°–90° C. After addition of B-side is complete, heating is maintained until all norbornene carbon-carbon double bonds of DCPD are reacted, as monitored by proton nuclear magnetic resonance (NMR). The resin solution is then cooled to room temperature. The

TABLE 1

| Example No. | Antiplasticizer and % loading | modulus (GPa)/ (T, °C.) | $T_g$ (TMA) °C. | TCE (5°–50.0° C.) |
|---|---|---|---|---|
| 1 | 0% (control) | 0.96 +/– .01 (25) | 156.9 | — |
| 2 | 5% o-Terphenyl | 1.16 +/– .03 (25) | 98.8 | 74.6 |
| 3 | 10% o-Terphenyl | 1.25 +/– .02 (25) | 115.5 | 68.4 |
| 4 | 15% o-Terphenyl | 1.01 +/– .01 (25) | 81.3 | 86.1 |
| 5 | 20% o-Terphenyl | 0.80 +/– .22 (24) | none observed | 84.1 |
| 6 | 5% m-Terphenyl | 1.14 +/– .01 (25) | none observed | 73.9 |
| 7 | 10% m-Terphenyl | 1.10 +/– .03 (25) | none observed | ---- |
| 8 | 15% m-Terphenyl | 0.86 +/– .15 (25) | none observed | ---- |
| 9 | 20% m-Terphenyl | 0.67 +/– .10 (25) | none observed | 99.8 |
| 10 | 10% Fluorene | 1.01 +/– .01 (25) | none observed | 60.5 |
| 11 | 10% Fluoranthene | 1.05 +/– .05 (25) | none observed | 68.9 |
| 12 | 5% Hexaphenyl-cyclotrisiloxane | 1.02 (23) | 117.3 | — |
| 13 | 10% Hexaphenyl-cyclotrisiloxane | 0.99 (24) | 106.2 | — |
| 14 | 15% Hexaphenyl-cyclotrisiloxane | Incompatible | — | — |

The results in Table 1 indicate that O-terphenyl at 5%, 10% and 15%, M-terphenyl at 5% and 10%, fluorene at 10%, and fluoranthene at 5%, act to increase the modulus of these compositions, and therefore act as antiplasticizers.

EXAMPLES 15–36

Polymer samples containing silicon atoms and carbon atoms are prepared in admixture with each of seven different antiplasticizers: 2-vinyl naphthalene, 9-vinyl anthracene, resin solution is then activated to a gel time (3 drops on a Fisher-Johns hot plate) of 1.5 minutes at 160° C. with 25 ppm Pt from a platinum catalyst (PC072, Hüls America, Piscataway, N.J.), added via syringe.

In Examples 15–36 set forth in Table 2, Tetramethylethylenediamine (TMEDA, a catalyst retardant which slows the room temperature polymerization reaction, and stabilizes the room temperature product) at 30 ppm is added, along with a desired antiplasticizer. In Examples 37–42 set forth in Table 3, diethylenetriamine (DETA, a catalyst retardant) is also added at 30 ppm, along with a desired antiplasticizer. The toluene is then stripped from the mixture at 50° C. for 1 hour in a rotary evaporator.

The stripped resin/antiplasticizer mix is poured into a preheated mold (at 100° C.) and cured under nitrogen at 160° C. for 1 hour, then 250° C. for 4 hours. The cured plaques are cut with a diamond saw.

The analysis for determination of the glass transition temperature ($T_g$) of the composition is measured on a Dupont Thermal Mechanical Analyzer (TMA, model 942 or 943, obtainable from DuPont of Wilmington, Del.). Dynamic mechanical vs. temperature data is collected on a Rheometrics instrument (model 605, obtainable from Rheometrics, Inc. of Piscataway, N.J.).

Finally, although the invention has been described with reference to particular means, materials and embodiments, it should be noted that the invention is not limited to the particulars disclosed, and extends to all equivalents within the scope of the claims.

What is claimed is:

1. A curable composition, comprising:

a reactive component curable to form a nonpolar polymer comprising (a) a polyene having at least two hydrosilation reactive carbon-carbon double bonds; and (b) a silicon compound, having at least two hydrosilation reactive ≡SiH groups, said silicon compound comprising at least one member selected from the group consisting of cyclic polysiloxanes, tetrahedral siloxysi-

TABLE 2

| Example No. | Antiplasticizer and loading | $T_g$ (°C.) | CTE, 60–100° C. (ppm/°C.) | G'(25° C.) ($10^{10}$ dyn/cm$_2$) | Comments (After Cure) |
|---|---|---|---|---|---|
| 15 | 0% (control) | 155 | 107 | 0.91 | clear |
| 16 | 5% vinyl naphthalene | 133 | 110 | 0.97 | hazy |
| 17 | 10% vinyl naphthalene | 105 | 109 | 1.15 | cloudy |
| 18 | 15% vinyl naphthalene | — | — | — | phase separation |
| 19 | 5% vinyl carbazole | 139 | 102 | 0.94 | clear |
| 20 | 10% vinyl carbazole | 119 | 89 | 1.14 | clear |
| 21 | 15% vinyl carbazole | 120 | 96 | 1.16 | clear |
| 22 | 5% vinyl anthracene | 170 | 104 | 0.90 | clear |
| 23 | 10% vinyl anthracene | 181 | 103 | 1.08 | clear |
| 24 | 15% vinyl anthracene | 152 | 91 | 1.03 | clear |
| 25 | 5% vinyl biphenyl | 143 | 105 | 0.96 | clear |
| 26 | 10% vinyl biphenyl | 102 | 123 | 1.14 | clear |
| 27 | 15% vinyl biphenyl | 75 | 172 | — | clear |
| 28 | 5% difluorobenzophenone | 166 | 116 | 0.88 | clear |
| 29 | 10% difluorobenzophenone | 176 | 115 | 0.98 | clear |
| 30 | 15% difluorobenzophenone | 163 | 119 | — | clear |
| 31 | 5% triphenylvinylsilane | 139 | 111 | 0.90 | clear |
| 32 | 10% triphenylvinylsilane | 137 | 103 | 1.00 | clear |
| 33 | 15% triphenylvinylsilane | 125 | 145 | 0.92 | clear |
| 34 | 5% acenaphthylene | 144 | 104 | 0.93 | clear |
| 35 | 10% acenaphthylene | 125 | 100 | 1.18 | clear |
| 36 | 15% acenaphthylene | 100 | 93 | — | clear |

The results reported in Tables 2 and 3 indicate that vinyl naphthalene, vinyl carbazole, vinyl anthracene, vinyl biphenyl, difluorobenzophenone, triphenylvinylsilane, and acenaphthylene all increase modulus and thus are acting as antiplasticizers.

Example 23 shows that at 10% vinyl anthracene, an increase in modulus and an increase in $T_g$ are obtained.

lanes, and linear polysiloxanes; wherein at least one member selected from the group consisting of the polyene and the silicon compound has more than two hydrosilation reactive sites and having a glass transition temperature of at least about 20° C.;

a hydrosilation catalyst; and

TABLE 3

| Example No. | Antiplasticizer and loading | $T_g$ (°C.) | CTE, 60–100° C. (ppm/°C.) | G' (25° C.) ($10^{10}$ dyn/cm$^2$) | |
|---|---|---|---|---|---|
| 37 | 0% (control) | 187 | 100.0 | 0.88 | |
| 38 | 10% vinyl carbazole | 130 | 99.3 | 1.06 | |
| 39 | 20% vinyl carbazole | — | — | — | broke, too brittle) |
| 40 | 15% vinyl anthracene | 176 | 87.6 | 1.04 | |
| 41 | 16.8% vinyl anthracene | 169 | 88.1 | 1.07 | |
| 42 | 15% acenaphthylene | 101 | (125) | 1.13 | | an antiplasticizer in an amount effective to substantially increase the modulus of the polymer, wherein said antiplasticizer comprises at least one member selected from the group consisting of o-terphenyl, m-terphenyl fluorene, fluoranthene, hexaphenylcyclotrisiloxane, 2-vinyl naphthalene, 9-vinyl anthracene, 4,4'-difluorobenzophenone, acenaphthylene, 9-vinyl carbazole, 4-vinyl biphenyl, and triphenylvinylsilane, and said antiplasticizer is present in said curable composition an amount of from about 1 to 30 weight percent based on the weight of said reactive component.

2. The curable composition according to claim 1, wherein said reactive component comprises a crosslinkable organosilicon prepolymer hydrosilation reaction product of:

(i) a polyene having at least two hydrosilation reactive carbon-carbon double bonds; and (ii) a silicon compound, having at least two hydrosilation reactive ≡SiH groups, and comprising at least one member selected from the group consisting of cyclic polysiloxanes, tetrahedral siloxysilanes, and linear polysiloxanes;

wherein at least one member selected from the group consisting of the polyene and the silicon compound has more than two hydrosilation reactive sites.

3. The curable composition according to claim 2, wherein:

(a) the polyene comprises a polycyclic polyene;

(b) the silicon compound comprises at least one member selected from the group consisting of:

(i) cyclic polysiloxanes having the formula:

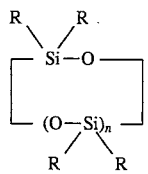

wherein R, which is the same or different, is hydrogen, or a saturated alkyl or alkoxy radical, or an aromatic or aryloxy radical, n is an integer from 2 to about 20, and R is hydrogen on at least two of the silicon atoms;

(ii) tetrahedral siloxysilanes having the formula:

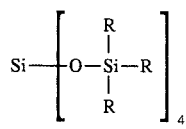

wherein R is as defined above, and is hydrogen on at least two silicon atoms in the molecule; and (iii) linear polysiloxanes having the formula:

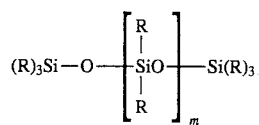

wherein R, which is the same or different, is hydrogen, or a saturated alkyl radical, or a phenyl radical, at least two R's are hydrogen, and m is an integer from about 0 to 1000; and wherein the ratio of (i) hydrosilation reactive carbon-carbon double bonds in the polyene, to (ii) ≡SiH groups in the silicon compound, is from about 0.1:1 to about 1.5:1.

4. The curable composition of claim 3, wherein the polycyclic polyene comprises dicyclopentadiene.

5. The curable composition of claim 1, wherein said antiplasticizer is present in said curable composition in an amount of from about 5 to 20 weight percent, based on the weight of said reactive component.

6. The curable composition according to claim 1, wherein said antiplasticizer is present in an amount of from about 5 to 15 weight percent, based on the weight of said reactive component.

7. A cured composition comprising:

a nonpolar polymer comprising the reaction product of (a) a polyene having at least two hydrosilation reactive carbon-carbon double bonds; and (b) a silicon compound, having at least two hydrosilation reactive ≡SiH groups, said silicon compound comprising at least one member selected from the group consisting of cyclic polysiloxanes, tetrahedral siloxysilanes and linear polysiloxanes;

wherein at least one member selected from the group consisting of the polyene and the silicon compound has more than two hydrosilation reactive sites and having a glass transition temperature of at least about 20° C.;

a hydrosilation catalyst; and an antiplasticizer in an amount effective to substantially increase the modulus of the polymer, wherein said antiplasticizer comprises at least one member selected from the group consisting of o-terphenyl, m-terphenyl, fluorene, fluoranthene, hexaphenylcyclotrisiloxane, 2-vinyl naphthalene, 9-vinyl anthracene, 4,4'-difluorobenzophenone, acenaphthylene, 9-vinyl carbazole, 4-vinyl biphenyl, and triphenylvinylsilane, and said antiplasticizer is present in said cured composition in an amount of from about 1 to 30 weight percent, based on the total weight of said polyene and said silicon compound.

8. The cured composition according to claim 7, wherein said nonpolar polymer is crosslinked and comprises repeating units from an organosilicon prepolymer comprising repeating units from a hydrosilation reaction product of:

(i) a polyene having at least two hydrosilation reactive carbon-carbon double bonds; and (ii) a silicon compound, having at least two hydrosilation reactive ≡SiH groups, and comprising at least one member selected from the group consisting of cyclic polysiloxanes, tetrahedral siloxysilanes, and linear polysiloxanes;

wherein at least one member selected from the group consisting of the polyene and the silicon compound has more than two hydrosilation reactive sites.

9. The cured composition according to claim 7, wherein said nonpolar polymer is crosslinked and comprises repeating units from:

(a) a polyene having at least two hydrosilation reactive carbon-carbon double bonds; and (b) a silicon compound having at least two hydrosilation reactive ≡SiH groups, said silicon compound comprising at least one member selected from the group consisting of cyclic polysiloxane, tetrahedral siloxysilane, and linear polysiloxane;

said cured composition further comprising a hydrosilation catalyst.

10. The cured composition according to claim 9, wherein:

(a) the polyene comprises a polycyclic polyene;

(b) the silicon compound comprises at least one member selected from the group consisting of:

(i) cyclic polysiloxanes having the formula:

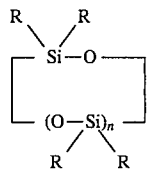

wherein R, which is the same or different, is hydrogen, or a saturated alkyl or alkoxy radical, or an aromatic or aryloxy radical, n is an integer from 2 to about 20, and R is hydrogen on at least two of the silicon atoms;

(ii) tetrahedral siloxysilanes having the formula:

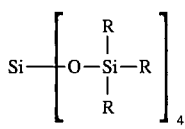

wherein R is as defined above, and is hydrogen on at least two silicon atoms in the molecule; and (iii) linear polysiloxanes having the formula:

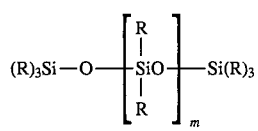

wherein R, which is the same or different, is hydrogen, or a saturated alkyl radical, or a phenyl radical, at least two R's are hydrogen, and m is an integer from about 0 to 1000; and wherein the ratio of (i) hydrosilation reactive carbon-carbon double bonds in the polyene, to (ii) ≡SiH groups in the silicon compound, is from about 0.1:1 to about 1.5:1.

11. The cured composition according to claim 10, wherein the polycyclic polyene comprises dicyclopentadiene.

12. The cured composition of claim 7, wherein said antiplasticizer is present in said cured composition in an amount of from about 5 to 20 weight percent, based on the total weight of said polyene and said silicon compound.

13. The cured composition according to claim 7, wherein said antiplasticizer is present in said cured composition in an amount of from about 5 to 15 weight percent, based on the weight of said nonpolar polymer, and said antiplasticizer increases said nonpolar polymer modulus by at least about 20 percent.

14. A process for preparing a curable composition, comprising:

mixing an antiplasticizer with a reactive component curable to form a nonpolar polymer comprising (a) a polyene having at least two hydrosilation reactive carbon-carbon double bonds; and b) a silicon compound, having at least two hydrosilation reactive ≡SiH groups, said silicon compound comprising at least one member selected from the group consisting of cyclic polysiloxanes, tetrahedral siloxysilanes, and linear polysiloxanes; wherein at least one member selected from the group consisting of the polyene and the silicon compound has more than two hydrosilation reactive sites and having a glass transition temperature of at least about 20° C., and a hydrosilation catalyst wherein said antiplasticizer being mixed with the reactive component in an amount effective to substantially increase the modulus of the polymer, wherein said antiplasticizer comprises at least one member selected from the group consisting of o-terphenyl, m-terphenyl, fluorene, fluoranthene, hexaphenylcyclotrisiloxane, 2-vinyl naphthalene, 9-vinyl anthracene, 4,4'-difluorobenzophenone, acenaphthylene, 9-vinyl carbazole, 4-vinyl biphenyl, and triphenylvinylsilane, and said antiplasticizer is present in said curable composition in an amount of from about 1 to 30 weight percent, based on the weight of said reactive component.

15. The process according to claim 14, wherein:

(a) the polyene comprises a polycyclic polyene;
(b) the silicon compound comprises at least one member selected from the group consisting of:
   (i) cyclic polysiloxanes having the formula:

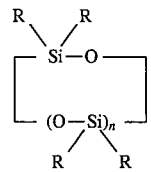

wherein R, which is the same or different, is hydrogen, or a saturated alkyl or alkoxy radical, or an aromatic or aryloxy radical, n is an integer from 2 to about 20, and R is hydrogen on at least two of the silicon atoms;

(ii) tetrahedral siloxysilanes having the formula:

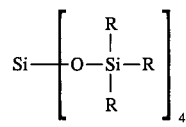

wherein R is as defined above, and is hydrogen on at least two silicon atoms in the molecule; and (iii) linear polysiloxanes having the formula:

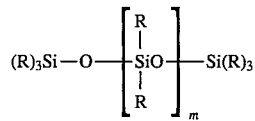

wherein R, which is the same or different, is hydrogen, or a saturated alkyl radical, or a phenyl radical, at least two R's are hydrogen, and m is an integer from about 0 to 1000; and wherein the ratio of (i) hydrosilation reactive carbon-carbon double bonds in the polyene, to (ii) ≡SiH groups in the silicon compound, is from about 0.1:1 to about 1.5:1.

16. The process according to claim 15, wherein the polycyclic polyene comprises dicyclopentadiene.

17. The process for preparing a curable composition of claim 14, wherein said antiplasticizer is present in said curable composition in an amount of from about 5 to 20 weight percent, based on the weight of said reactive component.

18. The process according to claim 14, wherein said antiplasticizer is present in an amount of from about 5 to 15 weight percent, based on the weight of said reactive component.

19. A process for preparing a cured composition, comprising:

curing a curable composition comprising an antiplasticizer mixed with a reactive component curable to form a nonpolar polymer comprising (a) a polyene having at least two hydrosilation reactive carbon-carbon double bonds; and (b) a silicon compound, having at least two hydrosilation reactive ≡SiH groups, said silicon compound comprising at least one member selected from the group consisting of cyclic polysiloxanes, tetrahedral siloxysilane and linear polysiloxanes; wherein at least one member selected from the group consisting of the polyene and the silicon compound has more than two hydrosilation reactive sites and having a glass transition temperature of at least about 20° C., and a hydrosilation catalyst wherein said antiplasticizer being present in an amount effective to substantially increase the modulus of the polymer, wherein said antiplasticizer comprises at least one member selected from the group consisting of o-terphenyl, m-terphenyl, fluorene, fluoranthene, hexaphenylcyclotrisiloxane, 2-vinyl naphthalene, 9-vinyl anthracene, 4,4'-difluorobenzophenone, acenaphthylene, 9-vinyl carbazole, 4-vinyl biphenyl, and triphenylvinylsilane, and said antiplasticizer is present in said cured composition in an amount of from about 1 to 30 weight percent, based on the weight of said reactive component.

20. The process according to claim 19, wherein:
(a) the polyene comprises a polycyclic polyene; and
(b) the silicon compound comprises at least one member selected from the group consisting of:
(i) cyclic polysiloxanes having the formula:

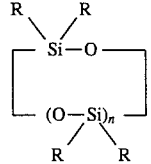

wherein R, which is the same or different, is hydrogen, or a saturated alkyl or alkoxy radical, or an aromatic or aryloxy radical, n is an integer from 2 to about 20, and R is hydrogen on at least two of the silicon atoms;
(ii) tetrahedral siloxysilanes having the formula:

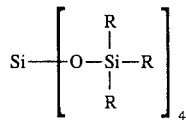

wherein R is as defined above, and is hydrogen on at least two silicon atoms in the molecule; and
(iii) linear polysiloxanes having the formula:

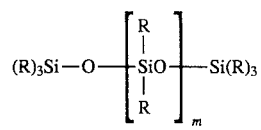

wherein R, which is the same or different, is hydrogen, or a saturated alkyl radical, or a phenyl radical, at least two R's are hydrogen, and m is an integer from about 0 to 1000; and
wherein the ratio of (i) hydrosilation reactive carbon-carbon double bonds in the polyene, to (ii) ≡SiH groups in the silicon compound, is from about 0.1:1 to about 1.5:1.

21. The process according to claim 20, wherein the polycyclic polyene comprises dicyclopentadiene.

22. The process for preparing the cured composition of claim 19, wherein said antiplasticizer is present in said cured composition in an amount of from about 5 to 20 weight percent, based on the weight of said reactive component.

23. The process according to claim 19 wherein said antiplasticizer is present in an amount of from about 5 to 15 weight percent, based on the weight of the nonpolar polymer, and the antiplasticizer increases the nonpolar polymer modulus by at least about 20 percent.

24. A curable composition, comprising:
a reactive component curable to form a polymer comprising (a) a polyene having at least two hydrosilation reactive carbon-carbon double bonds; and (b) a silicon compound, having at least two hydrosilation reactive ≡SiH groups, said silicon compound comprising at least one member selected from the group consisting of cyclic polysiloxanes, tetrahedral siloxysilanes, and linear polysiloxanes;
wherein at least one member selected from the group consisting of the polyene and the silicon compound has more than two hydrosilation reactive sites and having a glass transition temperature of at least about 20° C.;
a hydrosilation catalyst; and
an antiplasticizer in an amount effective to substantially increase the modulus of the polymer and increase the $T_g$ of the polymer, wherein said antiplasticizer comprises at least one member selected from the group consisting of o-terphenyl, m-terphenyl, fluorene, fluoranthene, hexaphenylcyclotrisiloxane, 2-vinyl naphthalene, 9-vinyl anthracene 4,4'-difluorobenzophenone, acenaphthylene, 9-vinyl carbazole, 4-vinyl biphenyl, and triphenylvinylsilane, and said antiplasticizer is present in said curable composition in an amount of from about 1 to 30 weight percent, based on the weight of said reactive component.

25. The curable composition according to claim 24, wherein said antiplasticizer comprises 9-vinylanthracene.

26. The curable composition of claim 24, wherein said antiplasticizer is present in said curable composition in an amount of from about 5 to 20 weight percent, based on the weight of said reactive component.

27. A composite material comprising a matrix impregnated with a curable composition, said curable composition comprising:
a reactive component curable to form a nonpolar polymer comprising (a) a polyene having at least two hydrosilation reactive carbon-carbon double bonds; and (b) a silicon compound, having at least two hydrosilation reactive ≡SiH groups, said silicon compound comprising at least one member selected from the group consisting of cyclic polysiloxanes, tetrahedral siloxysilanes, and linear polysiloxanes;
wherein at least one member selected from the group consisting of the polyene and the silicon compound has more than two hydrosilation reactive sites and having a glass transition temperature of at least 20° C.;
a hydrosilation catalyst; and an antiplasticizer in an amount effective to substantially increase the modulus of the polymer, wherein said antiplasticizer comprises at least one member selected from the group consisting of o-terphenyl, m-terphenyl, fluorene, fluoranthene, hexaphenylcyclotrisiloxane, 2-vinyl naphthalene, 9-vinyl anthracene, 4,4'-difluorobenzophenone, acenaphthylene, 9-vinyl carbazole, 4-vinyl biphenyl, and triphenylvinylsilane, and said antiplasticizer is present in said curable composition in an amount of from about 1 to 30 weight percent, based on the weight of said reactive component.

28. The composite material of claim 27, wherein said antiplasticizer is present in said curable composition in an amount of from about 5 to 20 weight percent, based on the weight of said reactive component.

* * * * *